US011348996B2

(12) United States Patent
Cho et al.

(10) Patent No.: US 11,348,996 B2
(45) Date of Patent: May 31, 2022

(54) SEMICONDUCTOR DEVICES INCLUDING SUPPORT PATTERN AND METHODS OF FABRICATING THE SAME

(71) Applicant: Samsung Electronics Co., Ltd., Suwon-si (KR)

(72) Inventors: Jae-Hwan Cho, Suwon-si (KR); Sangho Lee, Hwaseong-si (KR); Yoosang Hwang, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/860,136

(22) Filed: Apr. 28, 2020

(65) Prior Publication Data

US 2021/0043722 A1    Feb. 11, 2021

(30) Foreign Application Priority Data

Aug. 8, 2019  (KR) .................. 10-2019-0096895

(51) Int. Cl.
*H01L 49/02*   (2006.01)
*H01L 27/108*  (2006.01)
*H01L 27/02*   (2006.01)

(52) U.S. Cl.
CPC .......... *H01L 28/92* (2013.01); *H01L 27/0207* (2013.01); *H01L 27/108* (2013.01); *H01L 28/90* (2013.01)

(58) Field of Classification Search
CPC ............... H01L 27/10894; H01L 28/40; H01L 27/10897; H01L 29/66181; H01L 28/92; H01L 27/0207; H01L 27/108; H01L 28/90; H01L 27/10808; H01L 27/10852; H01L 21/76816; H01L 21/31144; H01L 21/76813; H01L 21/7685; H01L 21/027; H01L 21/76846; G03F 7/0002
See application file for complete search history.

(56) References Cited

U.S. PATENT DOCUMENTS

| 9,240,441 | B2 | 1/2016 | Yoon et al. |
| 10,249,706 | B1 | 4/2019 | Chang et al. |
| 10,276,668 | B2 | 4/2019 | Kim |
| 2007/0234538 | A1 | 10/2007 | Ahn |
| 2008/0242042 | A1 | 10/2008 | Kim et al. |
| 2018/0158827 | A1 | 6/2018 | You et al. |
| 2018/0158829 | A1* | 6/2018 | Song ................ H01L 21/76838 |
| 2020/0395364 | A1* | 12/2020 | Jung ................ H01L 27/10852 |
| 2021/0098461 | A1* | 4/2021 | Shih ..................... H01L 23/528 |

FOREIGN PATENT DOCUMENTS

KR    1020070076929    7/2007

\* cited by examiner

*Primary Examiner* — Edward Chin
(74) *Attorney, Agent, or Firm* — Myers Bigel, P.A.

(57) ABSTRACT

Disclosed are semiconductor devices including support patterns and methods of fabricating the same. The semiconductor devices may include a plurality of vertical structures on a substrate and a support pattern that contacts sidewalls of the plurality of vertical structures. The support pattern may include a plurality of support holes extending through the support pattern. The plurality of support holes may include a first support hole and a second support hole that are spaced apart from each other, and the first support hole may have a shape or size different from a shape or size of the second support hole.

6 Claims, 15 Drawing Sheets

SEMICONDUCTOR DEVICES INCLUDING SUPPORT PATTERN AND METHODS OF FABRICATING THE SAME

CROSS-REFERENCE TO RELATED APPLICATION

This U.S. nonprovisional application claims priority under 35 U.S.C § 119 to Korean Patent Application No. 10-2019-0096895 filed on Aug. 8, 2019 in the Korean Intellectual Property Office, the disclosures of which are hereby incorporated by reference in their entirety.

BACKGROUND

The present inventive concepts relate to a semiconductor device including a support pattern and a method of fabricating the same.

Semiconductor devices are beneficial in the electronics industry because of their small size, multi-functionality, and/or low fabrication cost. Semiconductor devices are being highly integrated with the remarkable development of the electronics industry. Line widths of patterns of semiconductor devices are being reduced for high integration thereof. Accordingly, new exposure techniques and/or expensive exposure techniques may be used for forming fine patterns. Various studies have recently been conducted for new integration techniques.

SUMMARY

Some example embodiments of the present inventive concepts provide semiconductor devices with improved reliability.

Some example embodiments of the present inventive concepts provide methods of fabricating a semiconductor device, which method may reduce manufacturing costs.

According to some example embodiments of the present inventive concepts, semiconductor devices may include a plurality of vertical structures on a substrate and a support pattern that contacts sidewalls of the plurality of vertical structures. The support pattern may include a plurality of support holes extending through the support pattern. The plurality of support holes may include a first support hole and a second support hole that are spaced apart from each other, and the first support hole may have a shape or size different from a shape or size of the second support hole.

According to some example embodiments of the present inventive concepts, semiconductor devices may include a plurality of word lines in a substrate and parallel to each other and a plurality of first impurity regions and a plurality of second impurity regions in the substrate. One of the plurality of first impurity regions and the plurality of second impurity regions may be between two adjacent word lines of the plurality of word lines, and the plurality of first impurity regions and the plurality of second impurity regions may be spaced apart from each other. The semiconductor devices may also include a plurality of bottom electrodes on the substrate and electrically connected to the plurality of first impurity regions, respectively, and a plurality of storage node contacts. Each of the plurality of storage node contacts may electrically connect a respective one of the plurality of bottom electrodes to a respective one of the plurality of first impurity regions. The semiconductor devices may further include a plurality of landing pads, a plurality of bit lines on the substrate and electrically connected to the plurality of second impurity regions, respectively, the plurality of bit lines crossing over the plurality of word lines, a plurality of bit-line contacts between a respective one of the plurality of bit lines and a respective one of the plurality of second impurity regions, and a support pattern in contact with a first portion of a sidewall of each of the plurality of bottom electrodes. Each of the plurality of landing pads may be between a respective one of the plurality of storage node contacts and a respective one of the plurality of bottom electrodes. The support pattern may include a plurality of support holes, and a second portion of the sidewall of each of the plurality of bottom electrodes defines a respective one of the plurality of support holes. The plurality of support holes may include a first support hole and a second support hole that are spaced apart from each other. When viewed in plan, the support pattern may include first inner sidewalls that define the first support hole and define a circumference of a circle. When viewed in plan, the support pattern may include second inner sidewalls that define the second support hole and define, respectively, sides of a triangle.

According to some example embodiments of the present inventive concepts, methods of fabricating a semiconductor device may include forming a mold layer and a support layer on a substrate, forming a plurality of vertical structures extending through the support layer and the mold layer and including six vertical structures arranged in a honeycomb shape when viewed in plan, forming a first mask layer on the support layer, forming a plurality of second mask patterns on the first mask layer, each of the plurality of second mask patterns overlapping portions of three neighboring vertical structures and having a circular shape when viewed in plan, and forming a plurality of mask spacers on the first mask layer. Each of the plurality of mask spacers may be on a sidewall of a respective one the plurality of second mask patterns, the plurality of mask spacers may be in contact with each other, and the first mask layer may be exposed to a first space between three neighboring mask spacers. The methods may also include removing the plurality of second mask patterns to form a plurality of second spaces that expose the first mask layer, forming a first mask pattern, using the plurality of mask spacers as an etching mask, by etching the first mask layer, and forming a plurality of support holes in the support layer, using the first mask pattern as an etching mask, by etching the support layer. Each of the plurality of mask spacers may have a ring shape when viewed in plan, and a sidewall of each of the plurality of vertical structures may include a portion defining a respective one of the plurality of support holes.

BRIEF DESCRIPTION OF THE DRAWINGS

FIGS. 5A to 9A illustrate plan views showing a method of fabricating a semiconductor device having the plan view of FIG. 3A.

FIGS. 5B to 9B illustrate cross-sectional views taken along lines A-A' and B-B' of FIGS. 5A to 9A, respectively.

DETAILED DESCRIPTION

Some example embodiments of the present inventive concepts will now be described in detail with reference to the accompanying drawings to aid in clearly explaining the present inventive concepts.

Figure 1:
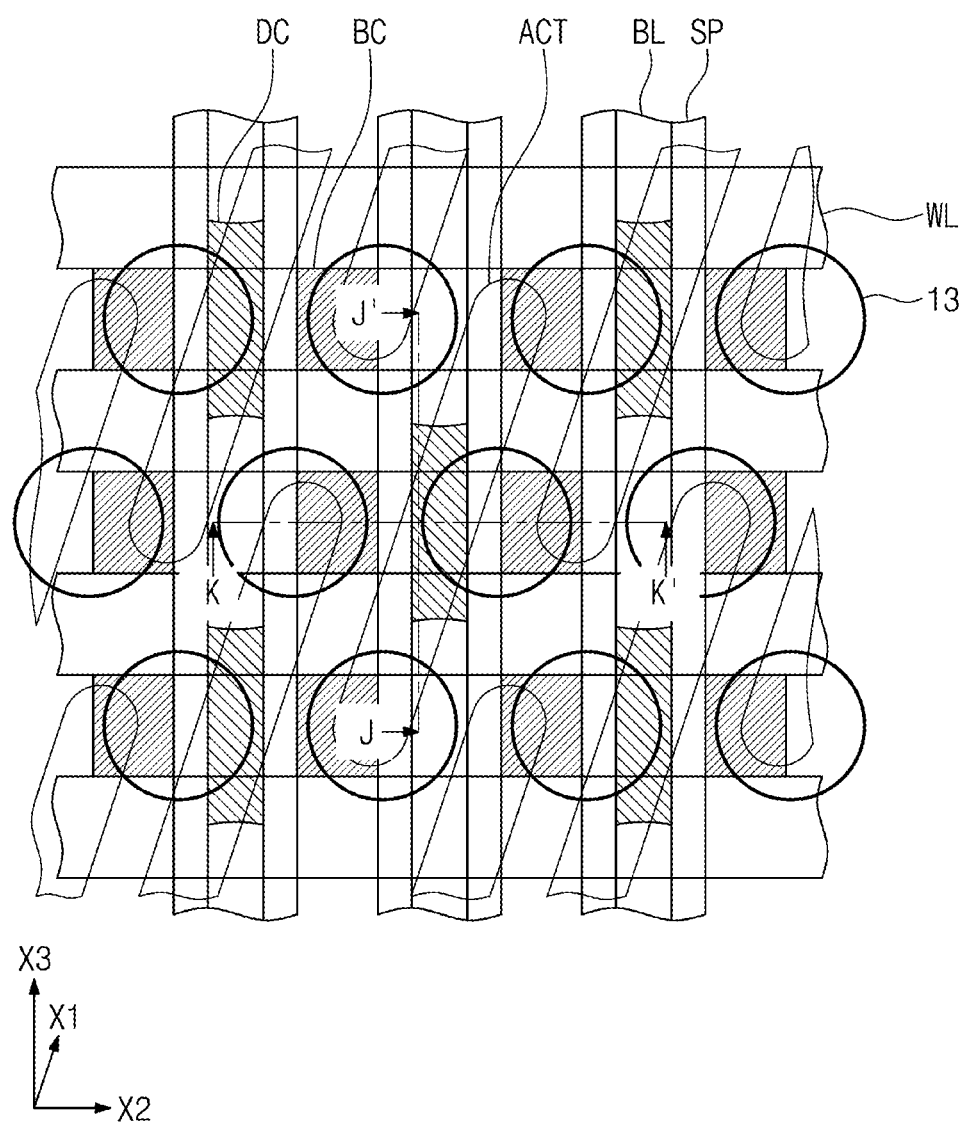
FIG. 1 illustrates a plan view showing a semiconductor device according to some example embodiments of the present inventive concepts.
Figure 2:
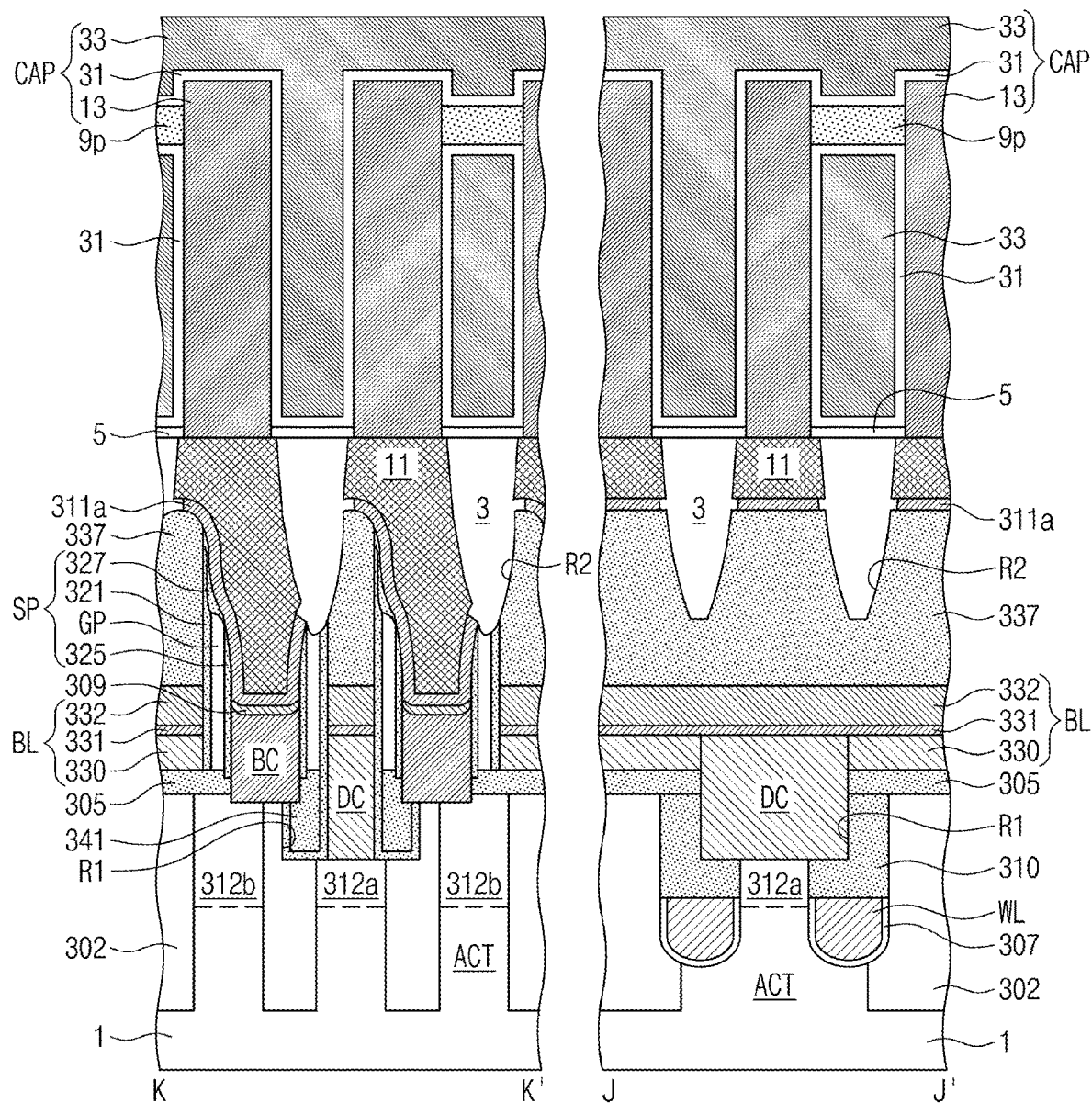
FIG. 2 illustrates a cross-sectional view taken along lines K-K' and J-J' of FIG. 1.

FIG. 1 illustrates a plan view showing a semiconductor device according to some example embodiments of the present inventive concepts. FIG. 2 illustrates a cross-sectional view taken along lines K-K' and J-J' of FIG. 1.

Referring to FIGS. 1 and 2, a substrate (e.g., a semiconductor substrate) 1 may be provided thereon with device isolation patterns 302 defining active sections ACT. Each of the active sections ACT may have an isolated shape. In some embodiments, the active sections ACT may be spaced apart from each other as illustrated in FIG. 1. The substrate 1 may be a semiconductor substrate. Each of the active sections ACT may have a bar shape elongated along a first direction X1 when viewed in plan. When viewed in plan, the active sections ACT may correspond to portions of the semiconductor substrate 1 that are surrounded by the device isolation patterns 302. The semiconductor substrate 1 may include a semiconductor material. The active sections ACT may be arranged parallel to each other in the first direction X1 such that one of the active sections ACT may have an end portion adjacent to a central portion of a neighboring one of the active sections ACT. "When viewed in plan" as used herein may be interchangeable with "when viewed in plan view."

Word lines WL may run across or may traverse the active sections ACT. The word lines WL may be disposed in grooves formed on the device isolation patterns 302 and the active sections ACT. The word lines WL may be parallel to a second direction X2 intersecting the first direction X1. In some embodiments, each of the word lines WL may extend longitudinally in the second direction X2 as illustrated in FIG. 1. The word lines WL may be formed of a conductive material. A gate dielectric layer 307 may be disposed between each of the word lines WL and an inner surface of each groove. Although not shown, each of the grooves may have a bottom surface that is relatively deeper in the device isolation pattern 302 and relatively shallower in the active section ACT. The gate dielectric layer 307 may include one or more of thermal oxide, silicon nitride, silicon oxynitride, and/or high-k dielectric. Each of the word lines WL may have a curved bottom surface. As used herein the term "and/or" includes any and all combinations of one or more of the associated listed items.

A first doped region 312a may be disposed in the active section ACT between a pair of word lines WL, and a pair of second doped regions 312b may be disposed in opposite edges of each active section ACT. The first and second doped regions 312a and 312b may be doped with, for example, N-type impurities. The first doped region 312a may correspond to a common drain region, and the second doped regions 312b may correspond to source regions. A transistor may be constituted by each of the word lines WL and its adjacent first and second doped regions 312a and 312b. Because the word lines WL are disposed in the grooves, each of the word lines WL may have thereunder a channel region whose length becomes increased within a limited planar area. Accordingly, short-channel effects and the like may be reduced or minimized.

The word lines WL may have their top surfaces lower than those of the active sections ACT. In some embodiments, the word lines WL may be recessed toward the substrate 1 with respect to the active sections ACT. A word-line capping pattern 310 may be disposed on each of the word lines WL. The word-line capping patterns 310 may have their linear shapes extending along longitudinal directions of the word lines WL, and may cover entire top surfaces of the word lines WL. The grooves may have their inner spaces not occupied by the word lines WL, and the word-line capping patterns 310 may fill (e.g., partially fill or completely fill) the unoccupied inner spaces of the grooves. The word-line capping patterns 310 may be formed of, for example, a silicon nitride layer.

An interlayer dielectric pattern 305 may be disposed on the semiconductor substrate 1. The interlayer dielectric pattern 305 may be formed of a single layer or multiple layers including one or more of a silicon oxide layer, a silicon nitride layer, and a silicon oxynitride layer. The interlayer dielectric pattern 305 may be formed to have island shapes spaced apart from each other in a plan view. The interlayer dielectric pattern 305 may be formed to simultaneously cover end portions of two adjacent active sections ACT.

Upper portions of the semiconductor substrate 1, the device isolation pattern 302, and the word-line capping pattern 310 may be partially recessed to form a first recess region R1. The first recess region R1 may have a sidewall aligned with that of the interlayer dielectric pattern 305.

Bit lines BL may be disposed on the interlayer dielectric pattern 305. The bit lines BL may run across or may traverse the word-line capping patterns 310 and the word lines WL. The bit lines BL may be parallel to a third direction X3 intersecting the first and second directions X1 and X2. In some embodiments, each of the bit lines BL may extend longitudinally in the third direction X3 as illustrated in FIG. 1. Each of the bit lines BL may include, for example, a bit-line polysilicon pattern 330, a bit-line ohmic pattern 331, and a bit-line metal-containing pattern 332 that are sequentially stacked. The bit-line polysilicon pattern 330 may include impurity-doped polysilicon and/or impurity-undoped polysilicon. The bit-line ohmic pattern 331 may include a metal silicide layer. The bit-line metal-containing pattern 332 may include one or more of metal (e.g., tungsten, titanium, and tantalum) and conductive metal nitride (e.g., titanium nitride, tantalum nitride, and tungsten nitride). A bit-line capping pattern 337 may be disposed on each of the bit lines BL. The bit-line capping patterns 337 may be formed of a dielectric material, such as a silicon nitride layer.

Bit-line contacts DC may be disposed in the first recess regions R1 intersecting the bit lines BL. The bit-line contacts DC may include impurity-doped polysilicon and/or impurity-undoped polysilicon. The bit-line contact DC may have a sidewall in contact with a lateral surface of the interlayer dielectric pattern 305. When viewed in plan as shown in FIG. 1, the bit-line contact DC may have a concave lateral surface in contact with the interlayer dielectric pattern 305. The bit-line contact DC may electrically connect the first doped region 312a to the bit line BL.

The first recess region R1 may have a space not occupied by the bit-line contact DC, and a lower buried dielectric pattern 341 may occupy that space of the first recess region R1. The lower buried dielectric pattern 341 may be formed of a single layer or multiple layers including one or more of a silicon oxide layer, a silicon nitride layer, and a silicon oxynitride layer.

Storage node contacts BC may be disposed between a pair of adjacent bit lines BL. The storage node contacts BC may be spaced apart from each other. The storage node contacts BC may include impurity-doped polysilicon and/or impurity-undoped polysilicon. The storage node contacts BC may have their concave top surfaces. Between the bit lines BL, a dielectric pattern (not shown) may be disposed between the storage node contacts BC.

A bit-line spacer SP may be interposed between the bit line BL and the storage node contact BC. The bit-line spacer SP may include a first sub-spacer 321 and a second sub-spacer 325 that are spaced apart from each other across a gap region GP. The gap region GP may also be called an air gap. The first sub-spacer 321 may cover a sidewall of the bit line BL and a sidewall of the bit-line capping pattern 337. The second sub-spacer 325 may be adjacent to the storage node contact BC. In some embodiments, the first sub-spacer 321 and the second sub-spacer 325 may include the same material. For example, the first sub-spacer 321 and the second sub-spacer 325 may include a silicon nitride layer.

The second sub-spacer 325 may have a bottom surface lower than that of the first sub-spacer 321. The second sub-spacer 325 may have a top end whose level is lower than that of a top end of the first sub-spacer 321. The first sub-spacer 321 may extend to cover a sidewall of the bit-line contact DC and also to cover a sidewall and a bottom surface of the first recess region R1. For example, the first sub-spacer 321 may be interposed between the bit-line contact DC and the lower buried dielectric pattern 341, between the word-line capping pattern 310 and the lower buried dielectric pattern 341, between the semiconductor substrate 1 and the lower buried dielectric pattern 341, and between the device isolation pattern 302 and the lower buried dielectric pattern 341.

A storage node ohmic layer 309 may be disposed on the storage node contact BC. The storage node ohmic layer 309 may include metal silicide. A diffusion stop pattern 311a may conformally cover the storage node ohmic layer 309, the first and second sub-spacers 321 and 325, and the bit-line capping pattern 337. The diffusion stop pattern 311a may include, for example, metal nitride, such as a titanium nitride layer and a tantalum nitride layer. A landing pad 11 may be disposed on the diffusion stop pattern 311a. The landing pad 11 may be formed of material containing metal, such as tungsten. The landing pad 11 may have an upper portion that covers a top surface of the bit-line capping pattern 337 and has a width greater than that of the storage node contact BC. A center of the landing pad 11 may shift in the second direction X2 away from a center of the storage node contact BC. A portion of the bit line BL may be vertically overlapped by the landing pad 11. The bit-line capping pattern 337 may have a first upper sidewall that is overlapped by the landing pad 11 and is covered with a third sub-spacer 327. A second recess region R2 may be formed on a second upper sidewall of the bit-line capping pattern 337. The second upper sidewall of the bit-line capping pattern 337 may be opposite the first upper sidewall thereof "An element A vertically overlapping an element B" (or similar language) as used herein means that at least one vertical line intersecting both the elements A and B exists. A vertical direction as used herein refers to a direction that is perpendicular to an upper surface of the semiconductor substrate 1.

A sum of widths of the first sub-spacer 321 and the third sub-spacer 327 on an upper portion of the bit-line spacer SP may be less than a sum of widths of the first sub-spacer 321, the gap region GP, and the second sub-spacer 325 on a lower portion of the bit-line spacer SP. Such a configuration may increase a formation margin for the landing pad 11. As a result, disconnection between the landing pad 11 and the storage node contact BC may be reduced or possibly prevented.

A separation dielectric pattern 3 may be disposed on the second recess region R2. The separation dielectric pattern 3 may define a top end of the gap region GP. The separation dielectric pattern 3 may include a silicon nitride layer, a silicon oxide layer, a silicon oxynitride layer, a silicon carbonitride layer, and/or a porous layer. The separation dielectric pattern 3 may have a top surface coplanar with those of the landing pads 11. The separation dielectric pattern 3 may be covered with an etch stop layer 5 between bottom electrodes 13 which will be discussed below. The etch stop layer 5 may include, for example, a dielectric material, such as a silicon nitride layer, a silicon oxide layer, and/or a silicon oxynitride layer.

Bottom electrodes 13 may be disposed on corresponding landing pads 11. The bottom electrode 13 may include one or more of an impurity-doped polysilicon layer, a metal nitride layer such as a titanium nitride layer, and a metal layer such as a tungsten layer, an aluminum layer, and a copper layer. The bottom electrode 13 may have a circular pillar shape, a hollow cylindrical shape, or a cup shape. A support pattern 9p may connect upper sidewalls of neighboring bottom electrodes 13. The support pattern 9p may include, for example, a dielectric material, such as a silicon nitride layer, a silicon oxide layer, a silicon oxynitride layer, and/or a silicon carbonitride layer (e.g., SiCN). The support pattern 9p will be further discussed in detail below. "An element having a circular pillar shape" as used herein may refer to an element having a cylindrical shape that includes a circular bottom surface and a vertical portion protruding from the circular bottom surface in a vertical direction. The vertical portion of the element may or may not have a sidewall perpendicular to the circular bottom surface. The vertical portion of the element may have a curved sidewall (e.g., a concave sidewall or a convex sidewall). The element having a cylindrical shape may have a uniform width along its height direction or may have a non-uniform width along its height direction. "An element having a circular pillar shape" may be referred to as "a vertical structure".

A dielectric layer 31 may cover surfaces of the bottom electrodes 13 and a surface of the support pattern 9p. The dielectric layer 31 may be formed of, for example, a metal oxide layer, such as an aluminum oxide layer, whose dielectric constant is greater than that of a silicon oxide layer.

The dielectric layer 31 may be covered with a top electrode 33. The top electrode 33 may include one or more of an impurity-doped polysilicon layer, an impurity-doped silicon germanium layer, a metal nitride layer such as a titanium nitride layer, and a metal layer such as a tungsten layer, an aluminum layer, and a copper layer. A capacitor CAP may be constituted by the bottom electrode 13, the dielectric layer 31, and the top electrode 33.

Figure 3A:
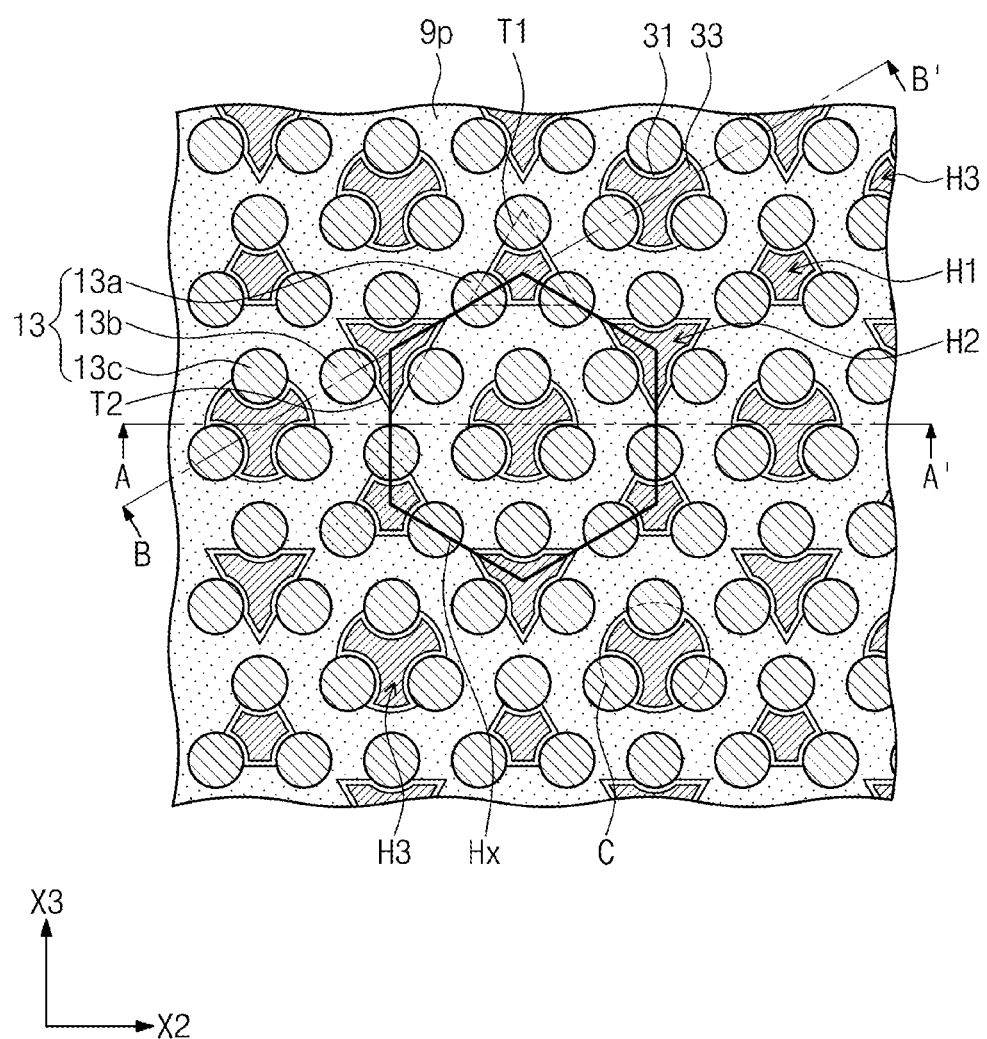
FIGS. 3A and 3B illustrate plan views showing a semiconductor device according to some example embodiments of the present inventive concepts.
Figure 3B:
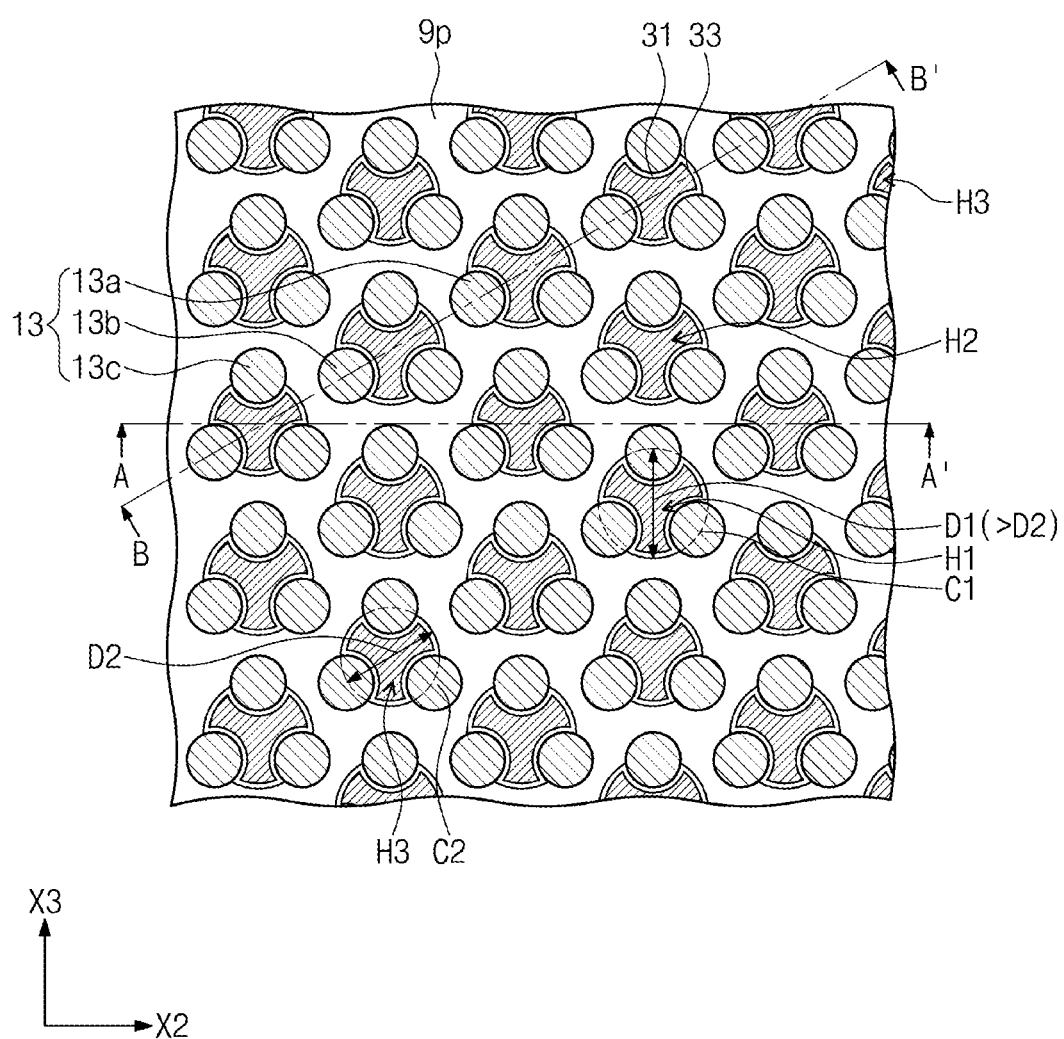
Figure 4:
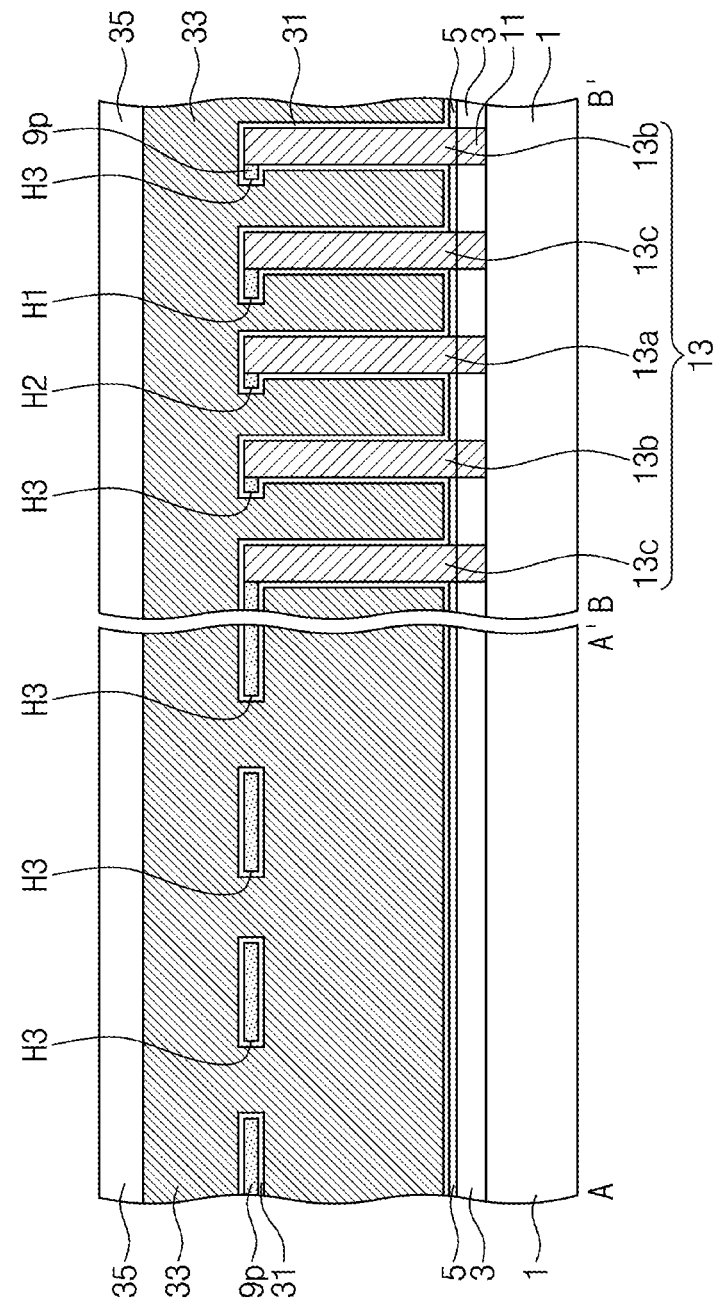
FIG. 4 illustrates a cross-sectional view taken along lines A-A' and B-B' of FIG. 3A or 3B.

FIGS. 3A and 3B illustrate plan views showing a semiconductor device according to some example embodiments of the present inventive concepts. FIG. 4 illustrates a cross-sectional view taken along lines A-A' and B-B' of FIG. 3A or 3B.

Referring to FIGS. 3A, 3B, and 4, there may be disposed a semiconductor substrate 1, a separation dielectric pattern 3, a landing pad 11, an etch stop layer 5, bottom electrodes 13, a support pattern 9p, a dielectric layer 31, a top electrode 33, and an upper interlayer dielectric layer 35. A structure below the bottom electrodes 13 may be identical or similar to that discussed above with reference to FIGS. 1 and 2. The support pattern 9p may be in contact with sidewalls of all of the bottom electrodes 13. The support pattern 9p may include support holes H1, H2, and H3. In some embodiments, each of the holes H1, H2, and H3 of the support pattern 9p may extend through the support pattern 9p in the vertical direction.

When viewed in plan as shown in FIGS. 3A and 3B, the bottom electrodes 13 may be arranged in a honeycomb shape. For example, a hexagon may be obtained when connecting centers of six bottom electrodes 13 that are adjacent to (or substantially equally spaced from) and surround one (i.e., a single) bottom electrode 13. Each of the support holes H1, H2, and H3 may simultaneously expose sidewalls of three bottom electrodes 13 that are adjacent to each other. In some embodiments, portions of sidewalls of three bottom electrodes 13 that are adjacent to each other may define one of the support holes H1, H2, and H3, and a layer (e.g., the dielectric layer 31) in the one of the support holes H1, H2, and H3 may contact those portions of the sidewalls of the three bottom electrodes 13. The support holes H1, H2, and H3 may include first support holes H1, second support holes H2, and third support holes H3. The bottom electrodes 13 may include first bottom electrodes 13a, second bottom electrodes 13b, and third bottom electrodes 13c.

For example, referring to FIG. 3A, when viewed in plan, a first triangle T1 may be obtained when connecting inner sidewalls of the first support hole H1. Those inner sidewalls of the first support hole H1 are defined by the support pattern 9p and may be straight. The first support hole H1 may expose sidewalls of three first bottom electrodes 13a that are adjacent to each other. Three first bottom electrodes 13a that are adjacent to each other may include respective sidewalls, and portions of these sidewalls of the three first bottom electrodes 13a may define a single first support hole H1. A layer (e.g., the dielectric layer 31) in the single first support hole H1 may contact those portions of the sidewalls of the three first bottom electrodes 13a. The first bottom electrodes 13a may be disposed on corresponding vertices of the first triangle T1. When viewed in plan, a second triangle T2 may be obtained when connecting inner sidewalls of the second support hole H2. Those inner sidewalls of the second support hole H2 are defined by the support pattern 9p and may be straight. The second support hole H2 may expose sidewalls of three second bottom electrodes 13b that are adjacent to each other. The second bottom electrodes 13b may be disposed on corresponding centers of edges of the second triangle T2. Three second bottom electrodes 13b that are adjacent to each other may include respective sidewalls, and portions of these sidewalls of the three second bottom electrodes 13b may define a single second support hole H2. A layer (e.g., the dielectric layer 31) in the single second support hole H2 may contact those portions of the sidewalls of those three second bottom electrodes 13b. A circle C may be obtained when connecting inner sidewalls of the third support hole H3. Those inner sidewalls of the third support hole H3 are defined by the support pattern 9p and may be curved. In some embodiments, each of those inner sidewalls of the third support hole H3 may be a portion of a circumference of the circle C in a plan view as illustrated in FIG. 3A. The third support hole H3 may expose sidewalls of three third bottom electrodes 13c that are adjacent to each other. The first triangle T1 and the second triangle T2 may have the same size (e.g., width). In some embodiments, sides of the first triangle T1 may have a first length equal to a second length of sides of the second triangle T2 as illustrated in FIG. 3A. The size (e.g., width) of the first and second triangles T1 and T2 may be different from a size (e.g., diameter) of the circle C. A hexagon may be obtained when connecting centers of the first and second support holes H1 and H2 that form six triangles T1 and T2 arranged around one third support hole H3 that forms the circle C. For example, three first support holes H1 and three second support holes H2 may be arranged around one third support hole H3 shaping the circle C. In some embodiments, three first support holes H1 and three second support holes H2 may be arranged in an alternating sequence around a single third support hole H3, and centers of those three first support holes H1 and three second support holes H2 may overlap vertices of a hexagon HX, respectively, as illustrated in FIG. 3A.

In some embodiments, the support pattern 9p may include three first inner sidewalls that define the first support hole H1 and define, respectively, sides of the first triangle T1 as illustrated in FIG. 3A. In some embodiments, the support pattern 9p may include six second inner sidewalls that define the second support hole H2, and pairs of the second inner sidewalls define, respectively, sides of the second triangle T2 as illustrated in FIG. 3A. In some embodiments, the support pattern 9p may include three third inner sidewalls that define the third support hole H3 and define the circumference of the circle C as illustrated in FIG. 3A. "A sidewall defines a side of a triangle" (or similar language) as used herein means that the sidewall defines a portion of the side of the triangle but does not necessarily mean that the sidewall defines the entire side of the triangle. "Sidewalls define a circumference of a circle" (or similar language) as used herein means that the sidewalls define portions of the circumference of the circle but does not necessarily mean that the sidewalls define the entire circumference of the circle.

In some embodiments, the first support hole H1, the third support hole H3, and the second support hole H2 may be immediately adjacent to each other and may be sequentially arranged along a direction that is different from the second direction X2 and the third direction X3 as illustrated in FIG. 3A. When the first support hole H1, the third support hole H3, the second support hole H2 are immediately adjacent to each other, there is no intervening support hole between the first support hole H1 and the third support hole H3 and between the third support hole H3 and the second support hole H2.

In some embodiments, referring to FIG. 3B, when viewed in plan, a first circle C1 may be obtained when connecting inner sidewalls of any of the first and second support holes H1 and H2. Those inner sidewalls of one of the first and second support holes H1 and H2 are defined by the support pattern 9p and may be curved. In some embodiments, those inner sidewalls of one of the first and second support holes H1 and H2 may define a circumference of the first circle C1 in plan as illustrated in FIG. 3B. A second circle C2 may be obtained when connecting inner sidewalls of the third support hole H3. Those inner sidewalls of third support hole H3 are defined by the support pattern 9p and may be curved. In some embodiments, those inner sidewalls of third support hole H3 may define a circumference of the second circle C2 in plan as illustrated in FIG. 3B. The first circle C1 may have a first diameter D1. The second circle C2 may have a second diameter D2. The first diameter D1 may be different from the second diameter D2. For example, the first diameter D1 may be greater than the second diameter D2.

In some embodiments, the support pattern 9p may include inner sidewalls that define a single support hole (e.g., the first support hole H1 or the second support hole H2), and these inner sidewalls of the support pattern 9p may define the circumference of the first circle C1 as illustrated in FIG. 3B. In some embodiments, the support pattern 9p may include three inner sidewalls that define a single third support hole H3, and these inner sidewalls of the support pattern 9p may define the circumference of the second circle C2 as illustrated in FIG. 3B.

The support pattern 9p may have a top surface coplanar with those of the bottom electrodes 13, as shown in FIG. 4, or lower than those of the bottom electrodes 13, as shown in FIG. 2. The support pattern 9p may have a single-layered structure as illustrated in FIG. 4 or 2, or a multi-layered structure having a plurality of layers at different levels.

FIGS. 5A to 9A illustrate plan views showing a method of fabricating a semiconductor device having the plan view of FIG. 3A. FIGS. 5B to 9B illustrate cross-sectional views taken along line A-A' and B-B' of FIGS. 5A to 9A, respectively.

Figure 5A:
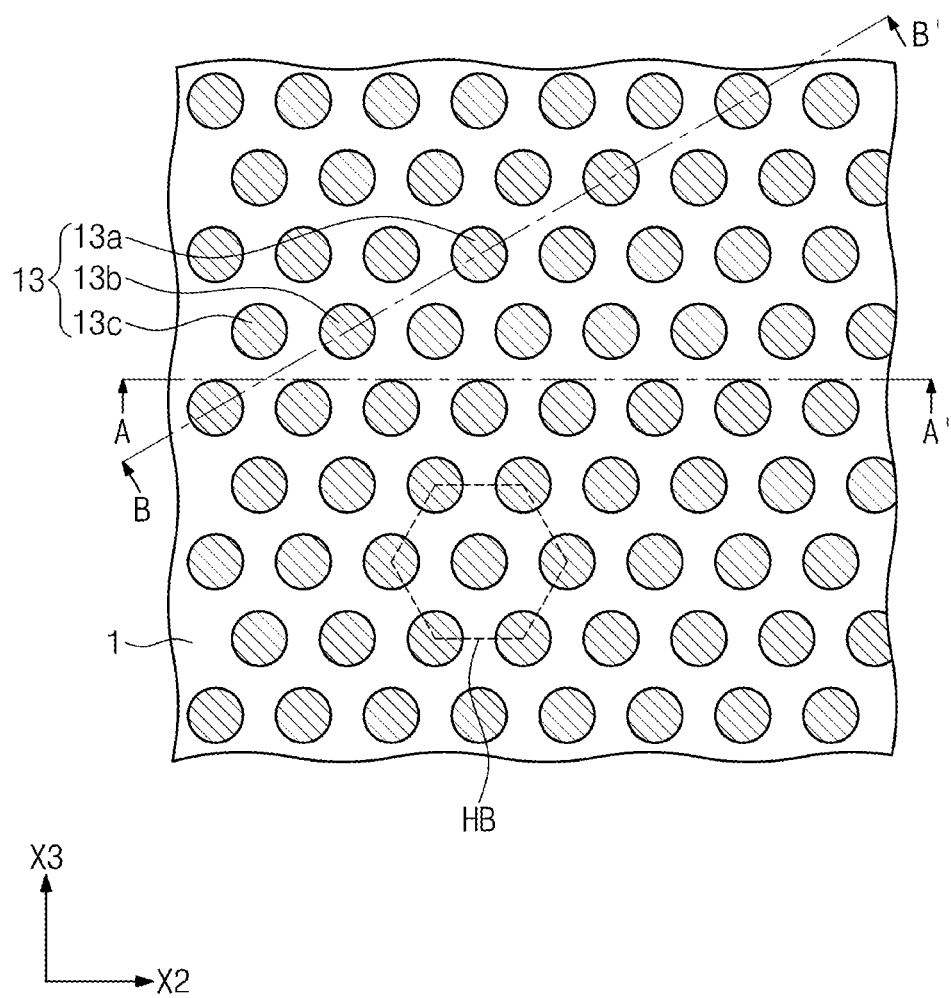
Figure 5B:
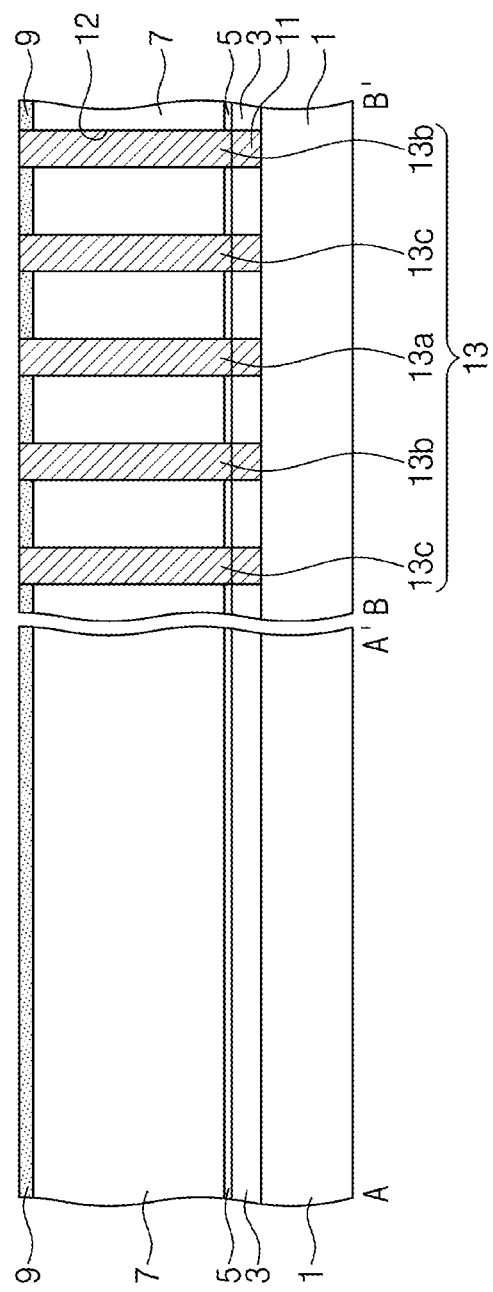

Referring to FIGS. 5A and 5B, landing pads 11 and a separation dielectric pattern 3 may be formed on a semiconductor substrate 1. An etch stop layer 5, a mold layer 7, and a support layer 9 may be sequentially formed on the landing pads 11 and the separation dielectric pattern 3. The mold layer 7 may be formed of a material having an etch selectivity with respect to both the etch stop layer 5 and the support layer 9. For example, the mold layer 7 may be formed of a silicon oxide layer. The support layer 9, the mold layer 7, and the etch stop layer 5 may be sequentially etched to form bottom-electrode holes 12 that expose the landing pads 11. A conductive layer may be formed to fill (e.g., partially fill or completely fill) the bottom-electrode holes 12, and an etch-back and/or chemical mechanical polishing (CMP) process may be performed to form bottom electrodes 13 in the bottom-electrode holes 12. The bottom electrodes 13 may be arranged in a honeycomb shape HB. For example, a hexagon may be obtained when connecting centers of six bottom electrodes 13 that are adjacent to (or substantially equally spaced from) and surround one bottom electrode 13. The bottom electrodes 13 may include first bottom electrodes 13a, second bottom electrodes 13b, and third bottom electrodes 13c.

Figure 6A:
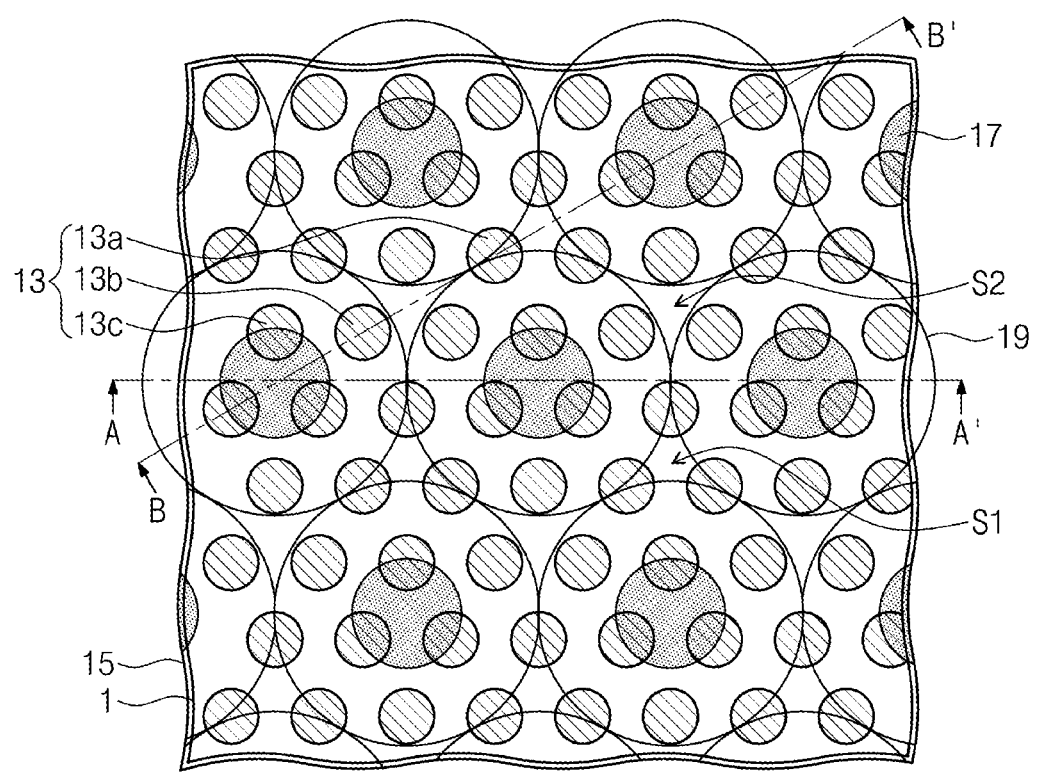
Figure 6A:
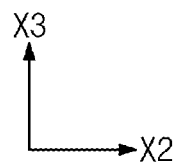
Figure 6B:
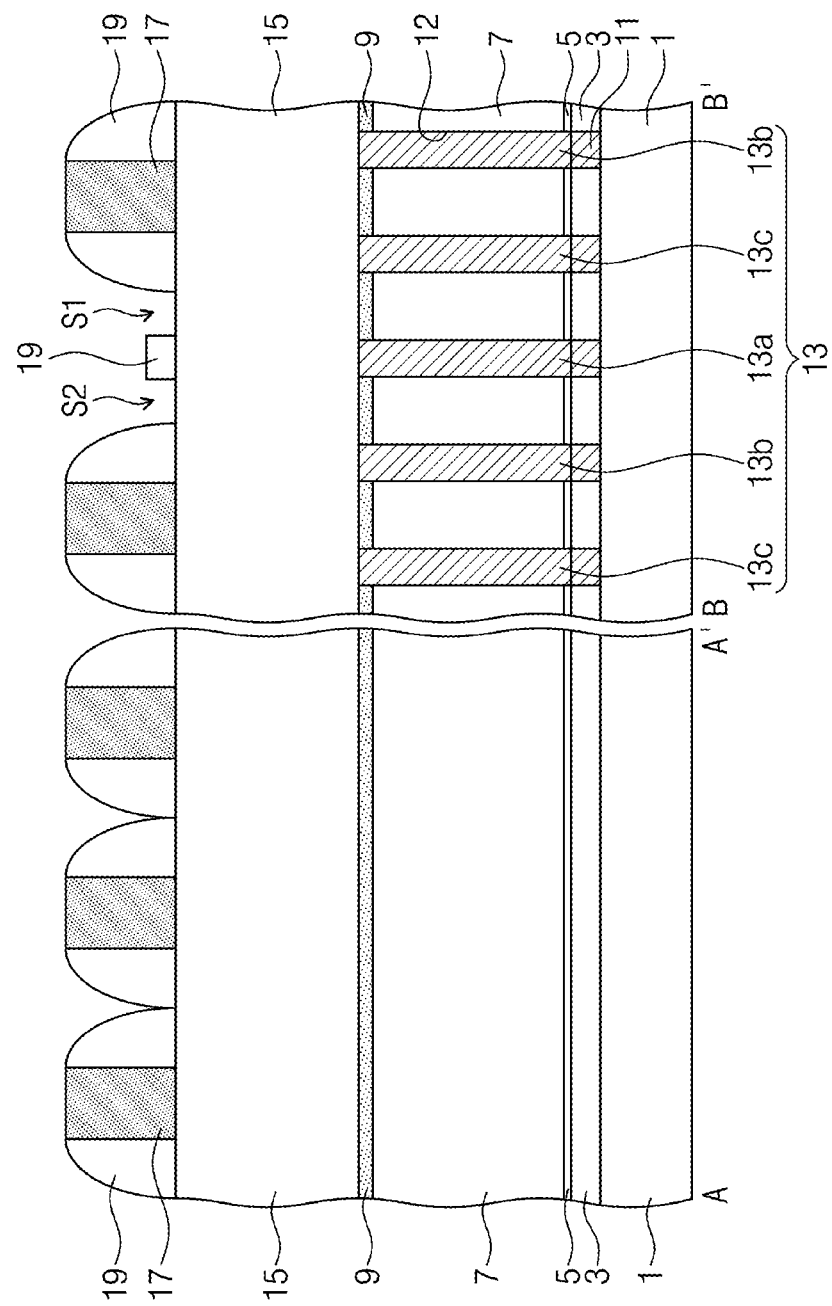

Referring to FIGS. 6A and 6B, a first mask layer 15 may be formed on the support layer 9. The first mask layer 15 may include a material, such as a polysilicon layer, a silicon carbonitride layer, and/or a silicon oxynitride layer, having an etch selectivity with respect to the support layer 9. Second mask patterns 17 may be formed on the first mask layer 15. The second mask patterns 17 may be spaced apart from each other and may each have a circular shape when viewed in plan. The second mask patterns 17 may be formed of a material having an etch selectivity with respect to the first mask layer 15, which material may include, for example, a photoresist pattern, a spin-on-hardmask (SOH) layer, a spin-on-carbon (SOC) layer, and/or an amorphous carbon layer (ACL). One second mask pattern 17 may be disposed to simultaneously overlap three third bottom electrodes 13c that are adjacent to each other. At least one bottom electrode 13 may be disposed between the second mask patterns 17 and not overlapped by the second mask patterns 17. The total number of the second mask patterns 17 may be less than that of support holes H1, H2, and H3 which will be formed later. An interval or a shortest distance between the second mask patterns 17 may be greater than that between support holes H1, H2, and H3 (e.g., a shortest distance between the first hole H1 and the second hole H2 closest to the first hole H1) which will be formed later. The second mask patterns 17 may be formed by employing an immersion photolithography apparatus.

A third mask layer may be conformally formed on the first mask layer 15, and then anisotropically etched to form mask spacers 19 that cover sidewalls of the second mask patterns 17. The mask spacers 19 may be formed of a material, such as a silicon oxide layer, having an etch selectivity with respect to both the first mask layer 15 and the second mask patterns 17. The mask spacers 19 may each have a ring shape when viewed in plan. The mask spacers 19 may be in contact with each other. The mask spacers 19 may have their edges that overlap the first bottom electrodes 13a. The second bottom electrodes 13b may be spaced apart from both the second mask patterns 17 and the edges of the mask spacers 19. In some embodiments, the second bottom electrodes 13b may be spaced apart from both the second mask patterns 17 and the edges of the mask spacers 19 in plan as illustrated in FIG. 6A.

A first space S1 and a second space S2 may be formed between the mask spacers 19 and may expose the first mask layer 15. For example, the first space S1 may be formed between three mask spacers 19 that are adjacent to each other. The second space S2 spaced apart from the first space S1 may be formed between other three mask spacers 19 that are adjacent to each other. When viewed in plan, the first space S1 and the second space S2 may each have a triangular-like shape when viewed in plan. The first bottom electrodes 13a may be overlapped by an edge of the first space S1. The second bottom electrodes 13b may be adjacent to an edge of the second space S2.

Figure 7A:
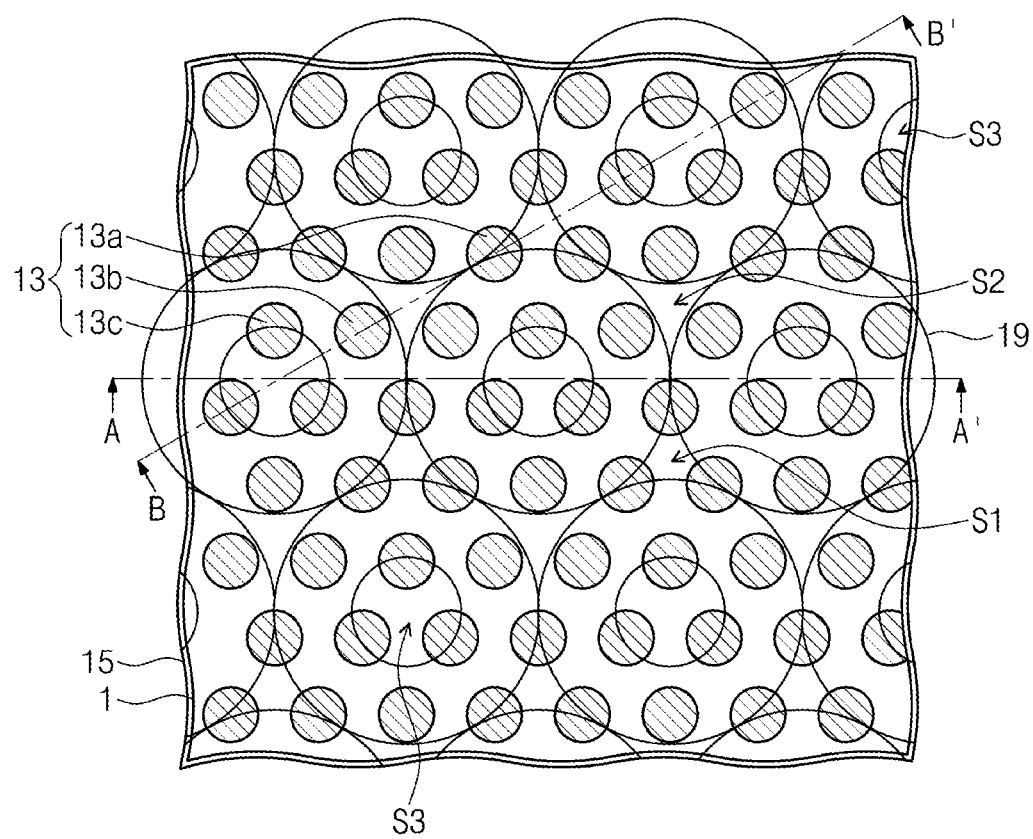
Figure 7B:
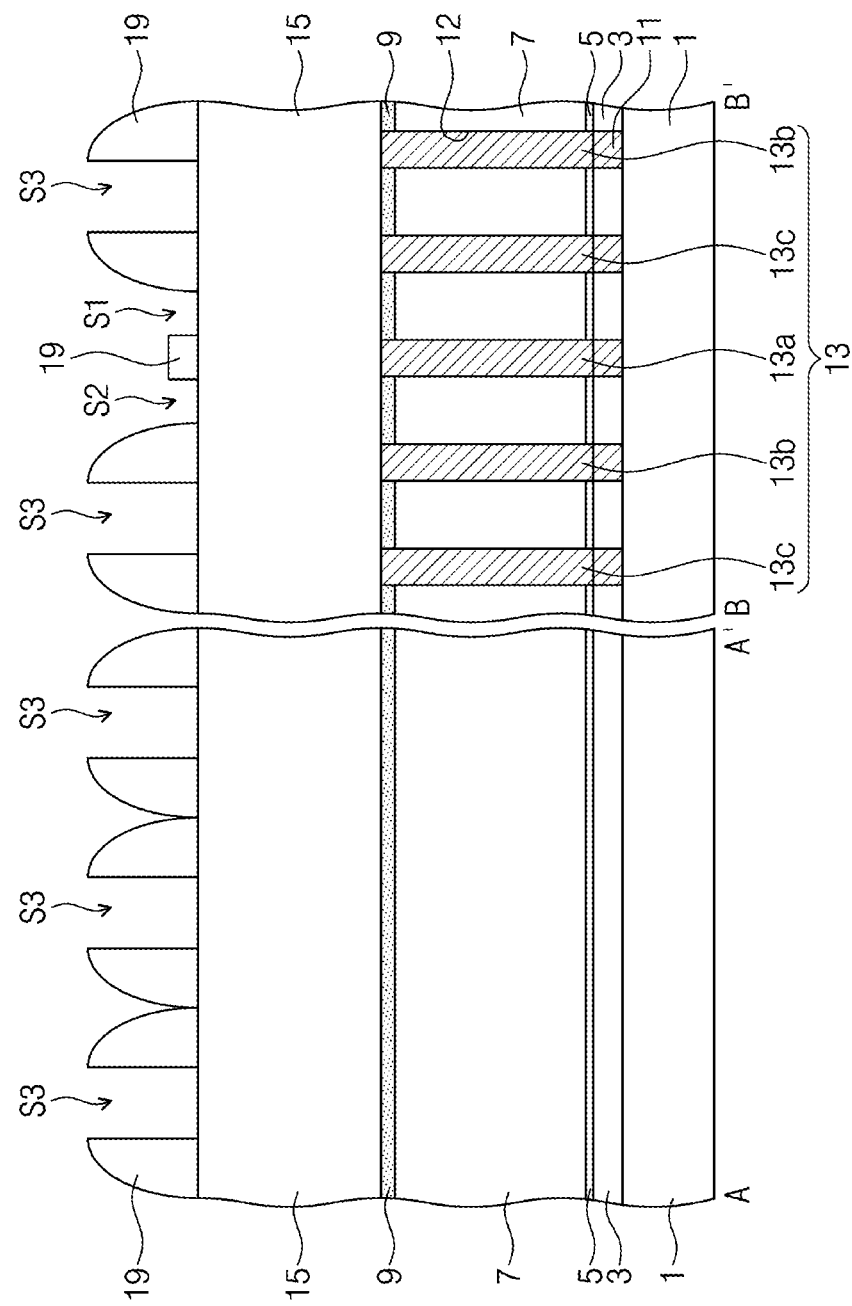
Figure 8A:
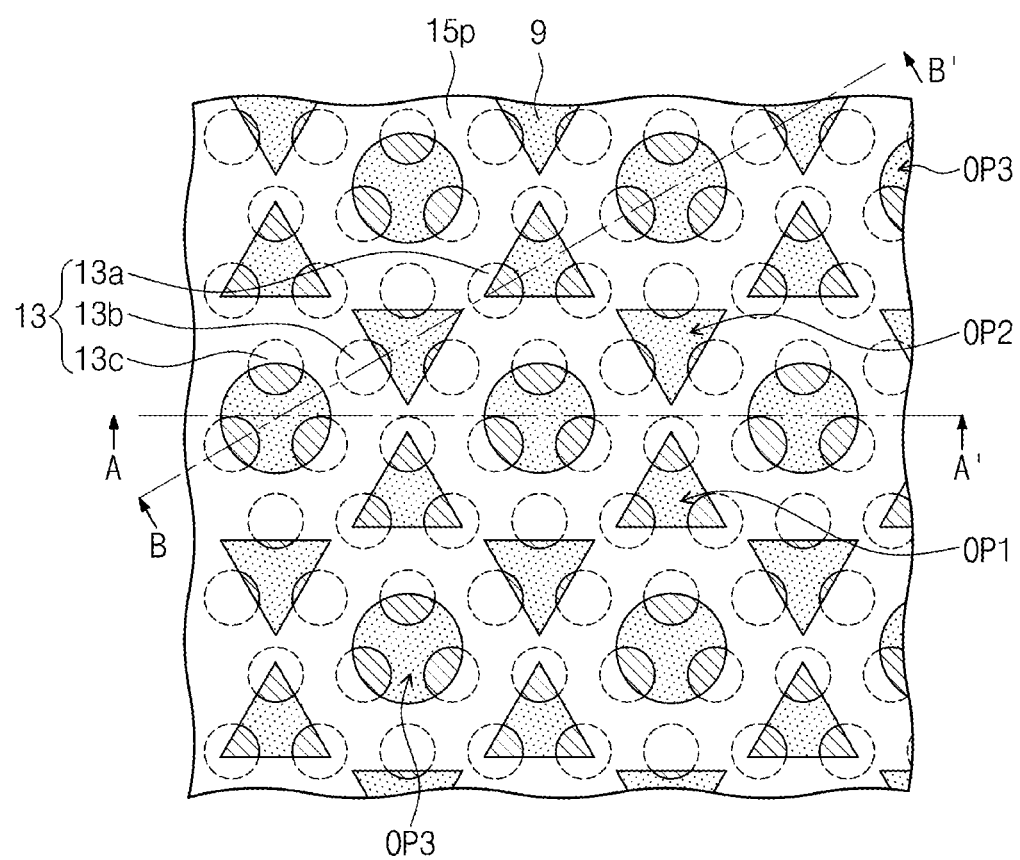
Figure 8B:
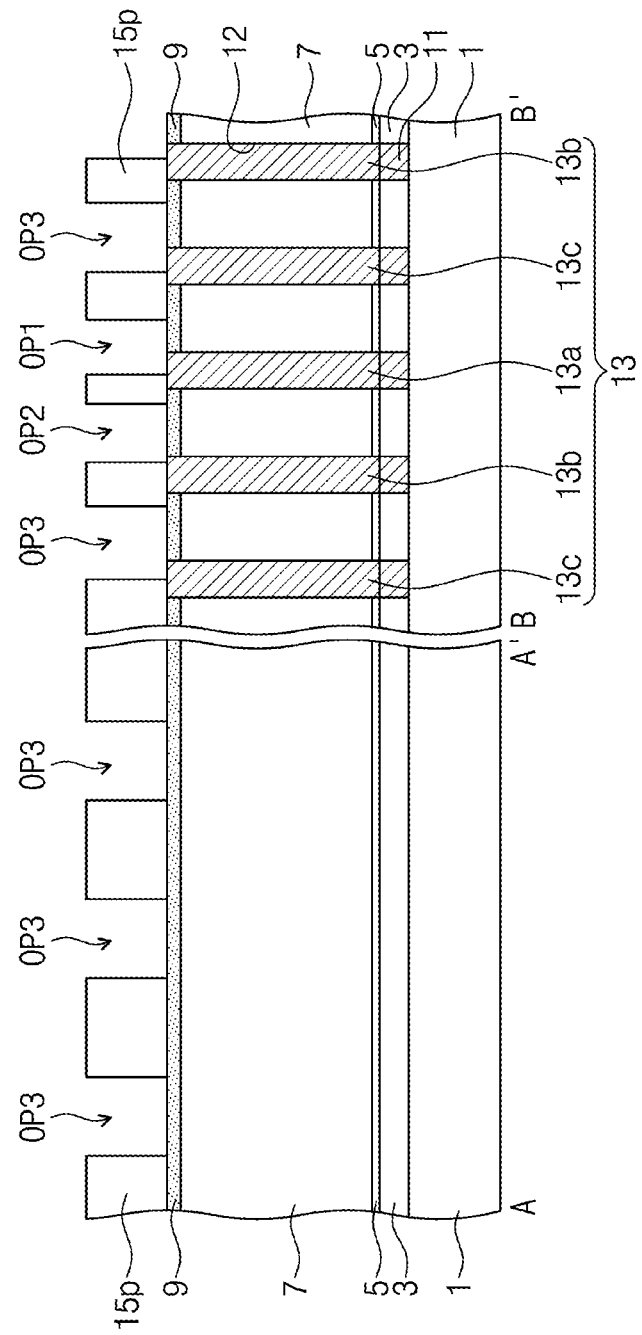
Figure 9A:
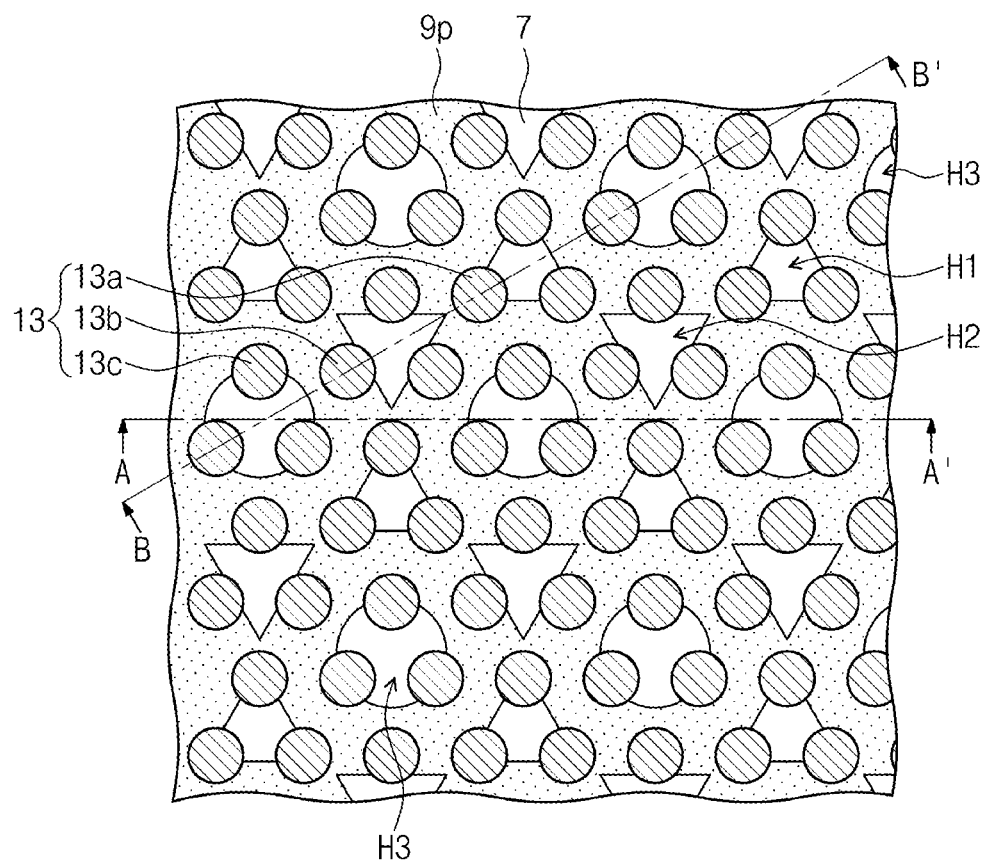
Figure 9B:
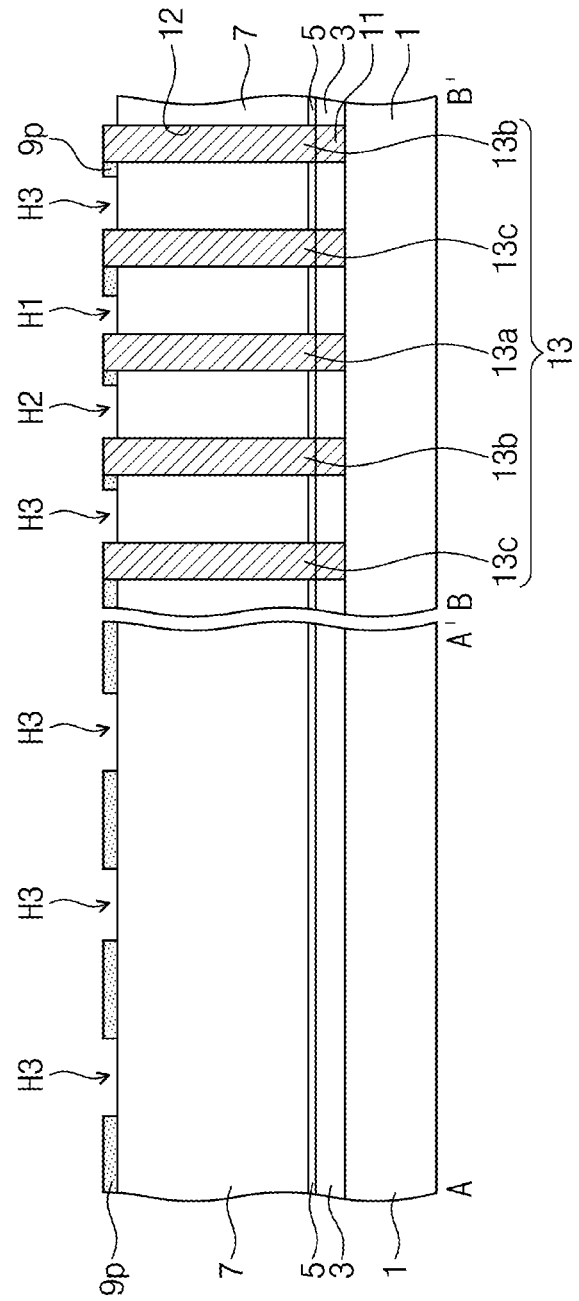

Referring to FIGS. 7A and 7B, an isotropic etching process may be performed such that the second mask patterns 17 may be selectively removed to form a third space S3 that is surrounded by the mask spacer 19 and exposes the first mask layer 15. The third space S3 may expose an inner sidewall of the mask spacer 19. The third space S3 may have a circular shape when viewed in plan. The third space S3 may have an edge that overlaps three third bottom electrodes 13c that are adjacent to each other.

Referring to FIGS. 7A, 7B, 8A, and 8B, the mask spacers 19 may be used as an etching mask to etch the first mask layer 15 to form a first mask pattern 15p. In this case, the first space S1 and the second space S2 may be transferred onto the first mask pattern 15p to form a triangular first opening OP1 and a triangular second opening OP2. In addition, the third space S3 may be transferred onto the first mask pattern 15p to form a circular third opening OP3. The first opening OP1 may expose portions of top surfaces of three first bottom electrodes 13a that are adjacent to each other and also expose a top surface of the support layer 9 between the first bottom electrodes 13a. The second opening OP2 may expose portions of top surfaces of three second bottom electrodes 13b that are adjacent to each other and also expose a top surface of the support layer 9 between the second bottom electrodes 13b. The third opening OP3 may expose portions of top surfaces of three third bottom electrodes 13c that are adjacent to each other and also expose a top surface of the support layer 9 between the third bottom electrodes 13c.

Referring to FIGS. 8A, 8B, 9A, and 9B, the first mask pattern 15p may be used as an etching mask to etch the support layer 9 to form a support pattern 9p. In this case, the first opening OP1 and the second opening OP2 may be transferred onto the support pattern 9p to form a triangular first support hole H1 and a triangular second support hole H2. In addition, the third opening OP3 may be transferred onto the support pattern 9p to form a circular third support hole H3. The first support hole H1 may expose portions of sidewalls of three first bottom electrodes 13a that are adjacent to each other and also expose a top surface of the mold layer 7 between the first bottom electrodes 13a. The second support hole H2 may expose portions of sidewalls of three second bottom electrodes 13b that are adjacent to each other and also expose a top surface of the mold layer 7 between the second bottom electrodes 13b. The third support hole H3 may expose portions of sidewalls of three third bottom electrodes 13c that are adjacent to each other and also expose a top surface of the mold layer 7 between the third bottom electrodes 13c.

Subsequently, an isotropic etching process may be performed to remove the mold layer 7 through the support holes H1, H2, and H3, thereby exposing surfaces of the support pattern 9p, the bottom electrodes 13, and the etch stop layer 5. In this case, the support pattern 9p may reduce or possibly prevent collapse of the bottom electrodes 13. A dielectric layer 31 and a top electrode 33 may be sequentially formed.

In the present inventive concepts, the following process options may be selected to control sizes and shapes of the first, second, and third support holes H1, H2, and H3.

An increase in isotropy or anisotropy of an etching gas may control sizes and shapes of the first, second, and third support holes H1, H2, and H3.

For example, when the first mask pattern 15p is formed, or when the support pattern 9p is formed, an increase in directionality of an etching gas (i.e., etchant) may allow the first, second, and third support holes H1, H2, and H3 to have their shapes that are identically transferred from initial shapes of the first, second, and third spaces S1, S2, and S3. In this case, the first and second support holes H1 and H2 may become triangular shaped.

When the first mask pattern 15p or the support pattern 9p is formed, an increase in isotropy of an etching gas (i.e., etchant) may form the first and second support holes H1 and H2 into a near-circular shape as shown in FIG. 3B. In this case, depending on the degree of etching of the first mask pattern 15p or the support pattern 9p, the first and second support holes H1 and H2 may be formed to have their sizes different from that of the third support hole H3.

In some embodiments, to increase planar sizes (e.g., widths) of the support holes H1, H2, and H3, before the first mask layer 15 is etched, a process may be additionally performed to reduce sizes of the mask spacers 19.

In some embodiments, when the support layer 9 is etched to form the support pattern 9p, an over-etching process may be performed on the support layer 9 such that an etchant may collide a top surface of the mold layer 7 and then may laterally travel to widen the first, second, and third support holes H1, H2, and H3. In this case, the first and second support holes H1 and H2 may be formed into a near-circular shape when viewed in plan as shown in FIG. 3B. When no over-etching process is performed on the support layer 9, the first and second support holes H1 and H2 may be formed into a near-triangular shape when viewed in plan as shown in FIG. 3A.

In some embodiments, a thickness of the first mask layer 15 may be adjusted to control sizes and shapes of the first, second, and third support holes H1, H2, and H3. An increase in thickness of the first mask layer 15 may form the first and second support holes H1 and H2 into a near-circular shape when viewed in plan as shown in FIG. 3B. A reduction in thickness of the first mask layer 15 may form the first and second support holes H1 and H2 into a near-triangular shape when viewed in plan as shown in FIG. 3A.

In the present inventive concepts, because an interval or a shortest distance between the second mask patterns 17 is greater than that between the support holes H1, H2, and H3 (e.g., a shortest distance between the first hole H1 and the second hole H2 closest to the first hole H1), the second mask patterns 17 may be formed by employing a relatively low-priced immersion photolithography apparatus instead of a relatively high-priced EUV exposure apparatus. As a result, manufacturing costs may be reduced.

Furthermore, the mask spacers 19 may be used to form the support holes H1, H2, and H3 that expose lateral surfaces of all of the bottom electrodes 13. Therefore, when an etching process is adopted to remove the mold layer 7 through the support holes H1, H2, and H3, the etching process may be performed in such a way that an etchant may have a uniform concentration regardless of position, and that the bottom electrodes 13 may not be over-etched. In addition, when the dielectric layer 31 and the top electrode 33 are formed, source gases may have a uniform concentration regardless of position, and thus the dielectric layer 31 and the top electrode 33 may each be formed to have a regular thickness (e.g., a uniform thickness) as a whole. As a result, a semiconductor device may be fabricated to have increased reliability.

A semiconductor device according to the present inventive concepts may be configured such that support holes of a support pattern expose sidewalls of all of bottom electrodes, which may result in an improvement in reliability of the semiconductor device.

Moreover, in a method of fabricating a semiconductor device according to the present inventive concepts, second mask patterns may be formed by employing a relatively low-priced immersion photolithography apparatus instead of a relatively high-priced EUV exposure apparatus, which may result in a reduction in manufacturing costs.

Although the present invention has been described in connection with some example embodiments of the present inventive concepts illustrated in the accompanying drawings, it will be understood by those skilled in the art that various changes and modifications may be made without departing from the scope of the present inventive concepts. It will be apparent to those skilled in the art that there are various possible modifications and changes to the example embodiments of the present inventive concepts without departing from the scope of the inventive concepts.

What is claimed is:

1. A semiconductor device comprising:
a plurality of vertical structures on a substrate; and
a support pattern that contacts sidewalls of the plurality of vertical structures,
wherein:
the support pattern includes a plurality of support holes extending through the support pattern,
the plurality of support holes include three first support holes of a first shape or size and three second support holes of a second shape and size that are sequentially and alternatingly arranged around a single support hole at a center of a hexagon,
the first shape or size is different from the second shape or size, and
centers of the three first support holes and the three second support holes overlap, respectively, vertices of the hexagon.

2. The semiconductor device of claim 1, wherein
when viewed in plan, the support pattern comprises first inner sidewalls that define each first support hole and define a circumference of a circle, and
when viewed in plan, the support pattern comprises second inner sidewalls that define each second support hole and define, respectively, sides of a triangle.

3. The semiconductor device of claim 1, wherein
when viewed in plan, the support pattern comprises first inner sidewalls that define each first support hole and define a circumference of a first circle,
when viewed in plan, the support pattern comprises second inner sidewalls that define each second support hole and define a circumference of a second circle, and
a diameter of the first circle is different from a diameter of the second circle.

4. The semiconductor device of claim 1, wherein the sidewall of each of the plurality of vertical structures comprises a portion defining a respective one of the plurality of support holes.

5. The semiconductor device of claim 1, wherein the plurality of vertical structures comprise three vertical structures that are adjacent to each other, and the three vertical structures define each first support hole or each second support hole.

6. The semiconductor device of claim 1, wherein the plurality of support holes further include a third support hole,
when viewed in plan, the support pattern comprises first inner sidewalls that define each first support hole and define a circumference of a circle,
when viewed in plan, the support pattern comprises second inner sidewalk that define each second support hole and define, respectively, sides of a first triangle,
when viewed in plan, the support pattern comprises third inner sidewalls that define the third support hole and define, respectively, sides of a second triangle, and
when viewed in plan, the first, second, and third support holes are immediately adjacent to each other and arranged along a first direction, and one of the first support holes is between one of the second support holes and the third support hole.

* * * * *